(12) United States Patent
Szydlowski et al.

(10) Patent No.: US 6,501,944 B1
(45) Date of Patent: Dec. 31, 2002

(54) RADIO RECEPTION APPARATUS AND METHOD FOR THE CONTROL OF A RADIO RECEPTION APPARATUS

(75) Inventors: Zbigniew Szydlowski, Hildesheim (DE); Raed S. Shatara, Munich (DE)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/516,759

(22) Filed: Mar. 1, 2000

(30) Foreign Application Priority Data

Mar. 1, 1999 (DE) .......................... 199 08 855

(51) Int. Cl.[7] .............................. H04B 1/06; H04B 7/00
(52) U.S. Cl. ..................................... 455/266; 455/307
(58) Field of Search .............................. 455/266, 307, 455/254, 295, 296, 303, 304

(56) References Cited

U.S. PATENT DOCUMENTS

| 4,352,208 A | | 9/1982 | Schroeder .................... 455/266 |
| 4,598,426 A | * | 7/1986 | Shiojima ..................... 455/266 |
| 5,095,534 A | * | 3/1992 | Hiyama ....................... 455/266 |
| 5,303,413 A | * | 4/1994 | Braegas ....................... 455/266 |
| 5,307,515 A | | 4/1994 | Kuo et al. ................... 455/295 |
| 5,339,455 A | * | 8/1994 | Vogt et al. ................... 455/266 |
| 5,475,871 A | * | 12/1995 | Shalev et al. ................ 455/70 |
| 5,564,093 A | * | 10/1996 | Matsumoto .................. 455/266 |
| 5,758,296 A | * | 5/1998 | Nakamura ................... 455/575 |
| 5,926,752 A | * | 7/1999 | Lin ............................ 455/323 |
| 6,178,314 B1 | * | 1/2001 | Whikehart et al. ...... 455/188.1 |

* cited by examiner

Primary Examiner—Daniel Hunter
Assistant Examiner—Tuan Tran
(74) Attorney, Agent, or Firm—Jimmy L. Funke

(57) ABSTRACT

The invention relates to a method for the control of the bandpass width in the filtering of an intermediate frequency signal of an audio receiver of a radio reception apparatus. A signal parameter of a user signal of the audio receiver which is received at a reception frequency is determined and taken into account and a signal parameter of at least one neighboring signal which is received at a neighboring frequency which is adjacent to the reception frequency is determined. The bandpass width of the intermediate frequency filtering is selected in dependence at least on the signal parameter which is determined from the user signal, on the signal parameter which is determined from the neighboring signal and on the frequency distance between the reception frequency and the user frequency. Furthermore, the invention relates to a corresponding radio reception apparatus.

21 Claims, 4 Drawing Sheets

RADIO RECEPTION APPARATUS AND METHOD FOR THE CONTROL OF A RADIO RECEPTION APPARATUS

TECHNICAL FIELD

The invention relates to a method for the control of the bandpass width in the filtering of an intermediate frequency signal of an audio receiver of a radio reception apparatus in which a signal parameter of a user signal of the audio receiver which is received at a reception frequency is determined and taken into account. The invention also relates to a corresponding radio reception apparatus with an audio receiver for the reception of a user signal at a reception frequency, an intermediate frequency filter unit for the filtering of an intermediate frequency signal corresponding to the user signal and a filter selection unit for the selection of a bandpass width for the intermediate frequency filter unit of the audio receiver.

BACKGROUND OF THE INVENTION

In radio reception apparatuses of this kind the user signal, i.e. the wanted signal, is received in an input circuit of the audio receiver by means of an antenna, pre-amplified and converted to an intermediate frequency signal in a heterodyning circuit so that the user signal is for example present as a frequency modulation of an intermediate frequency of 10.7 MHz. The intermediate frequency signal is amplified and bandpass filtered in the intermediate frequency filter unit with a specific bandpass width.

Known radio reception apparatuses have, for the selection of the bandpass width of the intermediate frequency filtering, a filter selector unit in which a suitable signal parameter of the user signal is determined and in which in dependence on this a corresponding bandpass width is set in the intermediate frequency filter unit. If for example a lower reception quality is detected, a narrower bandpass width is selected in order to filter the frequency-wise adjacent disturbance signals out of the user signal.

This filtering with a narrower bandpass width indeed reduces the influence of disturbance signals of this kind and thus improves the selectivity; it however also leads to a worsening of other parameters, such as for example the stereo channel separation. Therefore the filter selection unit causes the use of a greater bandpass width as soon as a higher reception quality is detected. Since the improvement of the reception quality however can be effected by the previously caused use of a narrower bandpass width, this control mechanism can lead to an audible and thus disadvantageous continual change among the various filters available.

SUMMARY OF THE INVENTION

An object of the invention is to provide a method for the control of the bandpass width in the intermediate frequency filtering in which a continual change among various bandpass widths is avoided.

This object is satisfied for a method of the initially named kind in that a signal parameter of at least one neighboring signal which is received at a neighboring frequency adjacent to the reception frequency is determined; and in that the bandpass width of the intermediate frequency filtering is selected in dependence at least on the signal parameter which is determined from the user signal, on the signal parameter which is determined from the neighboring signal and on the frequency distance between the reception frequency and the neighboring frequency.

It is thus provided in accordance with the invention to determine and take into account for the calculation and setting of the bandpass width not only a signal parameter which is associated with the audio user signal, but also at least one signal parameter which is associated with a disturbing neighboring signal on a different neighboring frequency which is adjacent to the reception frequency of the user signal.

In the context of this invention a signal parameter of the user signal is to be understood to be a parameter which can be determined from the user signal and which at least indirectly enables a statement on the quality of the signal reception in the audio receiver or on the presence of undesirable disturbing influences. For example the signal level or the signal strength of the user signal, in particular in the form of the electric field strength, or the deviation of the user signal, come under consideration as a signal parameter of this kind. A further possible signal parameter of the user signal can be given by an output signal of an associated reception quality detector, in particular by a so-called ultrasonic-noise (USN) signal, which provides information on the presence of neighboring signals.

In the method in accordance with the invention an unintentional continual change among different filters or filter bandwidths respectively can be more easily avoided, since with the relevant signal parameter of the neighboring signal a selection criterion can in principle be used which is not influenced by a change in the bandpass width for the user signal. As a result of this additional selection criterion, a criterion can also be used as the signal parameter of the user signal which, in comparison with the reception quality, which is taken into account in known methods, is not or is merely insignificantly influenced by a change of the bandpass width of the intermediate frequency filtering.

A signal parameter of the neighboring signal is to be understood in the sense of this invention to mean a parameter which can yield a statement on the strength of the associated neighboring signal and accordingly on the suitability of the neighboring signal for the disturbing influencing of the user signal. For example the signal strength, in particular the electrical signal strength, or the deviation of the neighboring signal can be used as such a parameter of the disturbing signal.

In this manner a direct feedback between the selected bandpass width on the one hand and the determined signal parameters on the other hand is avoided to a great extent, and the known regulation mechanism is replaced by a stable control.

The determination of the respective signal parameter of the user signal and of the neighboring signal can take place particularly effectively when the relevant signal is already transformed to an intermediate frequency signal and as such has been amplified and filtered as well as in particular demodulated again.

In order to select a corresponding bandpass width of the intermediate frequency filtering on the basis of the explained signal parameters of the user signal and the neighboring signal, these signal parameters can be compared relative to one another. It is in particular possible to compute the respective characteristic values with one another, for example to subtract them, to add them and/or to divide them, and in this to provide them with different weighting factors.

Preferably, the bandpass width is in principle selected all the narrower, the higher the ratio of the signal strength of the neighboring signal to the signal strength of the user signal and/or the lower the distance between the reception frequency and the neighboring frequency is.

Furthermore, it is preferred when the neighboring signal is determined by means of a separate additional receiver, the reception frequency of which, i.e. the neighboring frequency, can be set independently of the reception frequency which is set in the audio receiver. In this way the additional receiver can continually monitor different neighboring frequencies so that the current setting of the bandpass width of the intermediate frequency filtering can be continually monitored and corrected when appropriate, without it being necessary for the audio receiver to interrupt its reception at the reception frequency for this.

If the signal parameter of the neighboring signal can be determined in a correspondingly short time, it is however in principle also possible to receive the neighboring signals which are required for the selection of the bandpass width by means of the audio receiver, in that the latter continually changes, for short times and thus not perceivably by the listener, from the reception frequency to the relevant neighboring frequency and back.

If the neighboring signal is determined by means of an additional receiver, it is preferred when the latter is designed as a data receiver so that digitally coded radio data, in particular RDS signals, of all available radio stations can be evaluated by means of the additional receiver. These radio data can, for the reception frequency which is set in the audio receiver, for alternative reception frequencies of the radio program which is set in the audio receiver or for other radio programs, be determined, evaluated and/or held in readiness for the case of a subsequent manual change of the radio program.

In particular it is possible to take into account the bit error rate of an RDS signal which has been received by the additional receiver or by the audio receiver as an additional criterion for the selection of an intermediate frequency bandpass width.

It is of course possible to monitor many different neighboring frequencies. The respective determined signal parameter of a neighboring signal can for example be taken into account in that after each setting of a new neighboring frequency it is examined whether the disturbing influence of the corresponding neighboring signal requires a change of the currently set bandpass width of the intermediate frequency filtering. For this a current value of the relevant signal parameter of the user signal can be determined. In addition, between such monitorings of different neighboring frequencies, it can also be examined anew on the basis of which the last change of the bandpass width was carried whether those signal parameters of the user signal and the neighboring signal out still have the same values. In these examinations predetermined tolerances can be taken into account.

The monitoring of different neighboring signals or neighboring frequencies respectively is preferably limited to a restricted frequency band in the neighborhood of the user signal. For example in ultra short wave (frequency modulation) reception this monitoring can take place in frequency steps of 100 kHz, namely in a frequency neighborhood of ±300 kHz with respect to the reception frequency of the user signal.

In order to set a bandpass width which has been selected for an intermediate frequency filtering, one of a plurality of available filters of different bandpass width can be activated, or the filter properties of a digital filter can be varied quasi continuously in small steps and within predetermined extreme limits. It is possible to filter the intermediate frequency signal in dependence on the result of the explained monitoring asymmetrically, i.e. with different bandwidths in the positive and negative frequency neighborhood of the user signal.

It is a further object of the invention to create a radio reception apparatus in which a continual change among different bandpass widths in the intermediate frequency filter unit caused by feedback effects is avoided.

This object is satisfied for a radio reception apparatus of the initially named kind in that an additional receiver which is substantially independent of the audio receiver is provided for the reception of a neighboring signal on a neighboring frequency which is adjacent to the reception frequency of the audio receiver; in that a signal parameter of the neighboring signal of the additional receiver and a signal parameter of the user signal of the audio receiver can be determined by the filter selection unit; in that the filter selection unit has a signal processing unit for the computation at least of the signal parameter of the user signal, of the signal parameter of the neighboring signal and of the frequency distance between the reception frequency and the neighboring frequency with one another; and in that the bandpass width of the intermediate frequency filter unit of the audio receiver can be selected in dependence on an output signal of the signal processing unit.

Through the provision of a special additional receiver and a filter selection unit for the determination and corresponding processing of the signal parameters of the user signal and the neighboring signal, the advantages which have already been explained in connection with the method in accordance with the invention can be achieved.

The radio reception apparatus can be designed in accordance with the explained embodiments of the method in accordance with the invention. In particular the filter selection unit can have a frequency determination device for the determination of the distance between the reception frequency and the neighboring frequency. The signal processing unit can be formed by a microprocessor.

BRIEF DESCRIPTION OF THE DRAWINGS

The present invention will now be described, by way of example, with reference the accompanying drawings, in which.

DESCRIPTION OF THE PREFERRED EMBODIMENT

Figure 1:
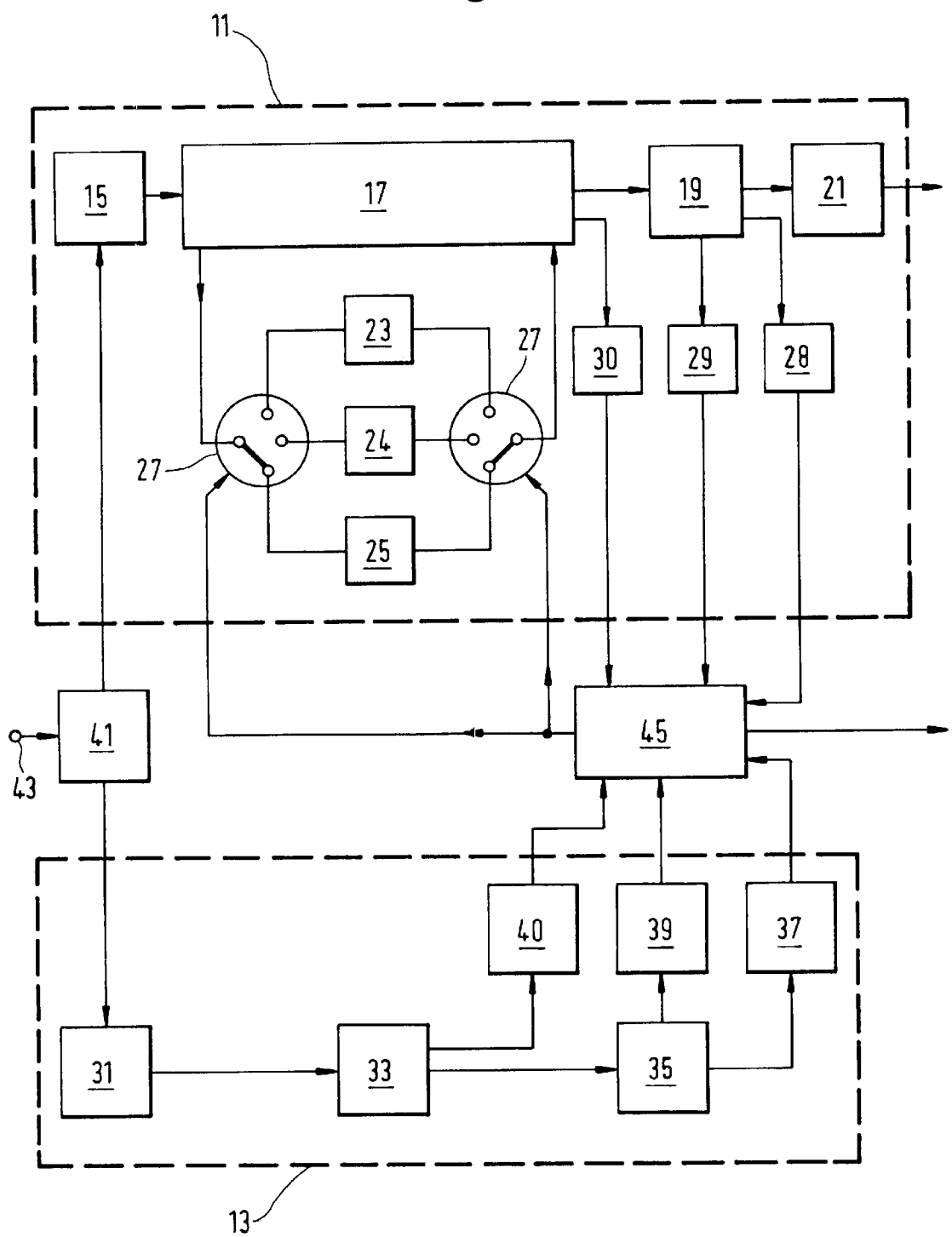
FIGS. 1 and 2 are schematic illustrations of two embodiments of the radio reception apparatus in accordance with the invention.

FIG. 1 schematically shows parts of a radio reception apparatus in accordance with the invention comprising an audio receiver 11 for the reception of an audio user signal at a set reception frequency and comprising an additional receiver 13 for the reception of a neighboring signal. The audio receiver 11 has an input and heterodyning stage 15, an intermediate frequency stage 17, a demodulator 19 and an audio stage 21 which are respectively connected one after the other. The intermediate frequency stage 17 has three bandpass filters 23, 24, 25 of different bandpass width, exactly one of which can be switched in by means of switch 27.

A respective output of the demodulator 19 is connected to an RDS decoder unit 28 and to a reception quality detector 29. In addition a level detector 30 for the determination of a signal parameter of the intermediate frequency user signal is placed after the intermediate frequency stage 17. The respective output of the level detector 30, of the reception quality detector 29 and of the RDS decoder unit 28 is connected to a microprocessor 45.

The additional receiver 13 has, respectively connected on after the other, an input and heterodyning stage 31, an intermediate frequency stage 33, a demodulator 35 and an RDS decoder unit 37. Furthermore, a reception quality detector 39 is placed after the demodulator 35 and a level detector 40 is placed after the intermediate frequency stage 33. The respective output of the level detector 40, of the reception quality detector 39 and of the RDS decoder unit 37 is connected to the microprocessor 45.

In addition the illustrated radio reception apparatus has a branching unit 41 which is connected at the input side to a reception antenna socket 43 and at the output side on the one hand to the input and heterodyning stage 15 of the audio receiver 11 and on the other hand to the input and heterodyning stage 31 of the additional receiver 13. Furthermore, FIG. 1 shows that one output of the microprocessor 45 is connected to the switches 27 of the intermediate frequency stage 17 and a further output is provided at the microprocessor 45 for the transmission of the obtained or computed data, in particular of the RDS data.

In the following the method of functioning of the apparatus which is shown in FIG. 1 will be explained.

Radio signals which are picked up by a non-illustrated reception antenna, which is connected to socket 43, are divided in the branching unit 41 and are each transmitted to the input and heterodyning stage 15, 31 of the audio receiver 11 and the additional receiver 13 respectively. There the radio signals corresponding to the reception frequency and the neighboring frequency respectively are pre-amplified and converted in a heterodyning circuit to intermediate frequency signals in which the information comprised in the respective radio signal is contained as frequency modulation of an intermediate frequency carrier wave. In the following intermediate frequency stage 17 or 33 respectively the intermediate frequency signal is amplified and filtered, with the three filters 23, 24, 25 being available in the audio receiver 11.

Then the respective intermediate frequency signal is on the one hand demodulated in the associated demodulator 19 or 35 respectively. On the other hand the intermediate frequency signal is conducted from the respective intermediate frequency stage 17, 33 to the associated level detector 30 or 40 respectively, which determines from the intermediate frequency user signal or the intermediate frequency neighboring signal the respective received field strength. In addition the two reception quality detectors 29 and 39 determine from the output signals of the demodulators 19 and 35 respectively, which are placed ahead of the reception quality detectors, a possibly present ultrasonicnoise (USN) signal. Values corresponding to the received field strengths and to the determined USN signals are transmitted from the relevant detectors 30, 40 and 29, 39 respectively to the microprocessor 45.

In the audio stage 21 of the audio receiver 11 the audio information which is contained in the demodulated signal is won and transmitted further. In addition, RDS information which is associated with the user signal is determined in the RDS decoder unit 28 of the audio receiver 11 and transmitted further to the microprocessor 45. In the additional receiver 13 the RDS decoder unit 37 reads the RDS information from the demodulated signal and transmits the latter to the microprocessor 45.

The microprocessor 45 examines whether a new bandpass width for the filtering of the user signal within the intermediate frequency stage 17 of the audio receiver 11 is required and where appropriate causes by means of the switch 27 the switching in of that filter 23, 24 or 25 which corresponds to a newly selected bandpass width. This examination and selection of a bandpass width takes place within the microprocessor 45 in dependence on the values of the field strength of the user signal and of the neighboring signal which are determined by the detectors 30 and 40 respectively, on USN signal values which correspond to the user signal and to the neighboring signal, on the bit error rate of the user signal which is determined from the signal of the RDS decoder unit 28 as well as on the distance between the frequency of the user signal and that of the neighboring signal.

Whereas the reception frequency of the audio receiver 11 fundamentally remains the same as long as the user does not make a change or, in the case of an RDS system, an alternative frequency of the same radio program is not automatically switched over to, new neighboring frequencies in the neighborhood of the reception frequency of the audio receiver 11 are set either at regular time intervals or substantially continually by means of the microprocessor 45 at the input and heterodyning stage 31 of the additional receiver 13. The information from the level detectors 30 and 40, the reception quality detectors 29 and 39 and from the decoder units 28 and 37 which is taken into account in the microprocessor 45 thus relates on the one hand to the user signal reception frequency which is set at the input and heterodyning stage 15 of the audio receiver 11 and on the other hand to the regularly or continually varied reception frequency of the additional receiver 13, i.e. the neighboring frequency.

It should be noted in regard to the construction in accordance with FIG. 1 that for example the reception quality detector 39 of the additional receiver 13 is not absolutely necessary and that for the realization of the invention with a particularly simple construction, the reception quality detector 29 and the RDS decoder unit 28 of the audio receiver 11 can be dispensed with.

Figure 2:
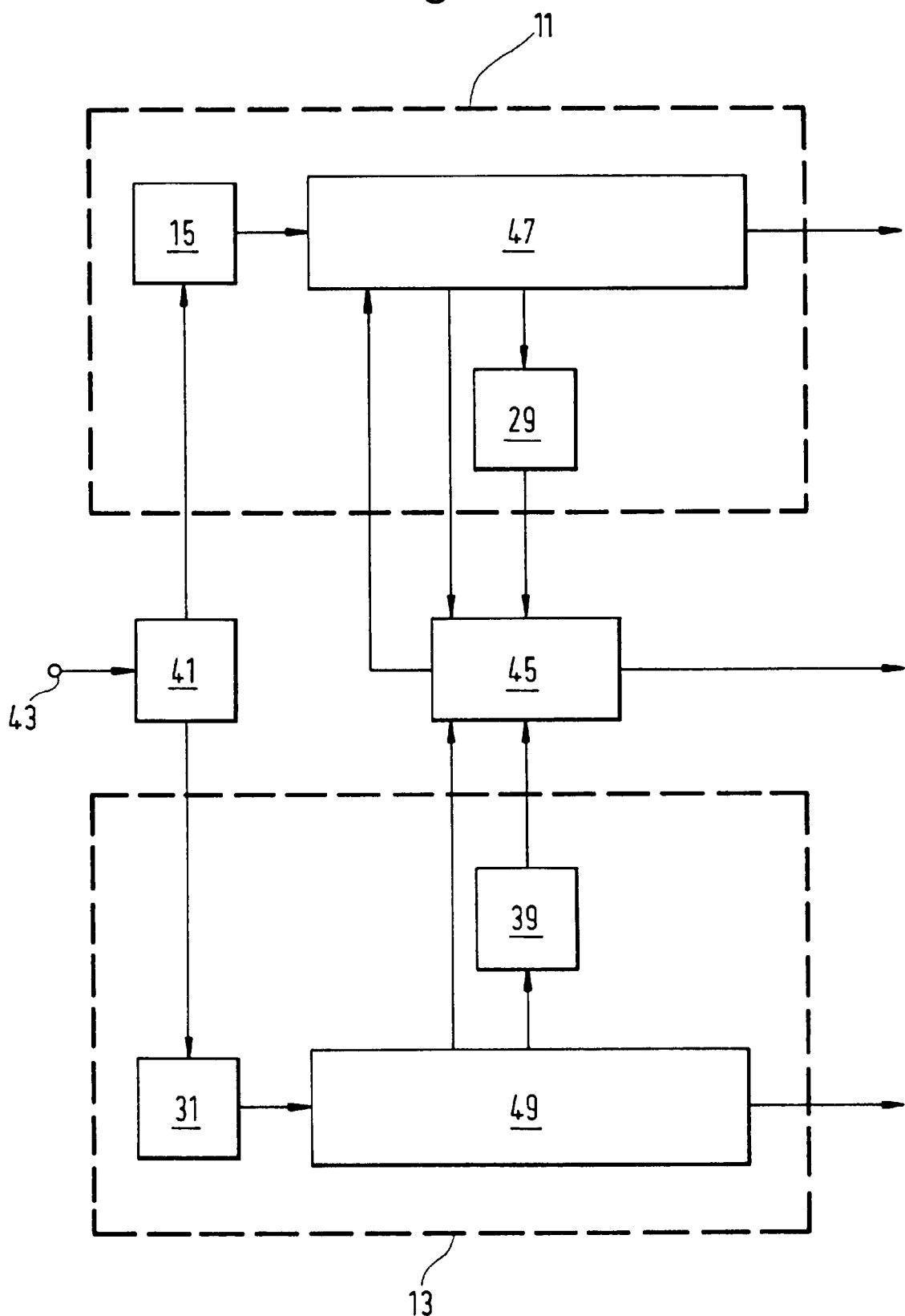

FIG. 2 schematically shows a further embodiment of the radio reception apparatus in accordance with the invention. Parts with substantially similar construction and equivalent function to those in the embodiment in accordance with FIG. 1 are provided with the same reference symbols. In contrast to the embodiment in accordance with FIG. 1 the intermediate frequency stage 17 including the filters 23, 24, 25 and the switch 27 as well as the demodulator 19, the audio stage 21, the level detector 30 and the RDS decoder unit 28 are integrated within the audio receiver 11 into a digital signal processing unit 47. The intermediate frequency signal is thus filtered here by means of a digital filter which is controlled by the microprocessor 45, with it being possible to vary the bandpass width of the digital filter within a predetermined minimum and maximum value in a large number of graduations.

The analogous intermediate frequency stage 33, the level detector 40, the demodulator 35 and the RDS decoder unit 37 of the additional receiver 13 of the apparatus illustrated in FIG. 1 are likewise replaced by a digital signal processing unit 49 in the embodiment in accordance with FIG. 2.

The method of functioning of the invention will be explained in more detail with reference to FIG. 3. The latter shows a possible variation of the intermediate frequency bandwidth in the presence of a disturbing transmitter. In each case an amplitude plot 51 of the user signal with a larger filter bandwidth, an amplitude plot 51' of the user signal with a narrower filter bandwidth and an amplitude plot 52 of the neighboring signal are illustrated as the amplitude A in dependence on the frequency F which is set. These amplitudes correspond for example to the signal level of the field strength of the relevant signal, such as can be determined by the level detectors 30, 40 of the radio reception apparatus in accordance with FIG. 1. A reception frequency $RF_{act}$ which for example is currently set in the audio receiver 11 in accordance with FIGS. 1 and 2 for the user signal and the maximum value $A(RF_{act})$ of the signal amplitude corresponding to it within the amplitude plots 51, 51' are illustrated in FIG. 3.

In specific frequency steps within a respective frequency range 53 above and below the current reception frequency $Rf_{act}$, the signal amplitude of disturbance signals is determined, for example by means of the additional receiver 13 in accordance with FIGS. 1 and 2. A neighboring frequency NFi which is investigated in this manner and the corresponding value of the amplitude $A(NF_i)$ are likewise shown in FIG. 3. In the illustrated example the neighboring frequency $NF_i$ currently corresponds to the transmission frequency of a radio program which is different from the one which is set, with a substantially higher amplitude $A(NF_i)$ than the amplitude $A(RF_{act})$ of the user signal.

Figure 3:
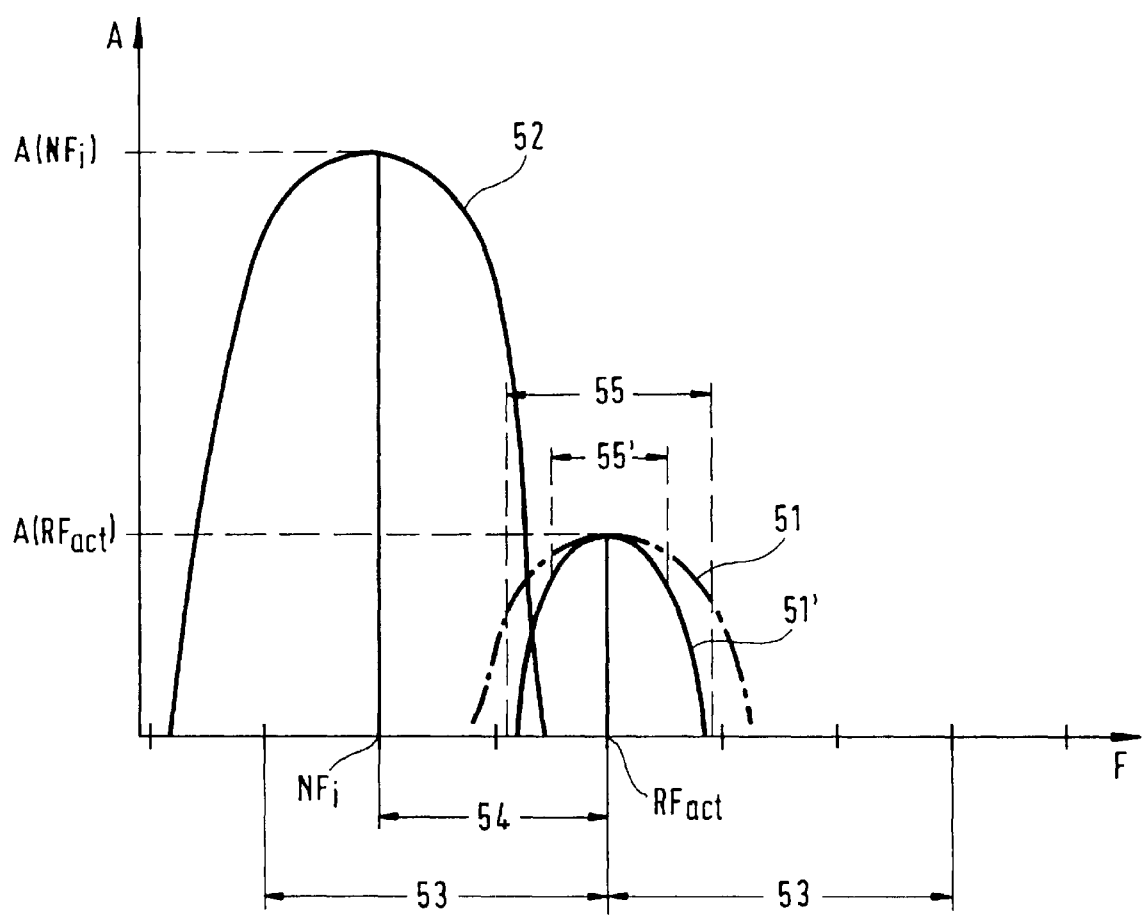
FIG. 3 is a change of the bandpass width of the intermediate frequency filtering of a user signal in the presence of a disturbing neighboring signal.

On the basis of the determined values of the signal amplitudes $A(RF_{act})$ and $A(NF_i)$ and on the basis of the distance 54 between the two frequencies $RF_{act}$ and $NF_i$ a bandpass width 55 or 55' is determined for the intermediate frequency filtering of the relevant audio receiver, as is schematically illustrated in FIG. 3. Since the amplitude $A(NF_i)$ of the disturbing neighboring signal is comparatively large with respect to the amplitude $A(RF_{act})$ of the currently set user signal, starting from the bandpass width 55 a narrower bandpass width 55' can be selected and set. Accordingly, the amplitude plot 51' of the user signal narrows with respect to the previous plot 51, and the overlap with the amplitude plot 52 of the disturbing neighboring signal decreases.

Figure 4:
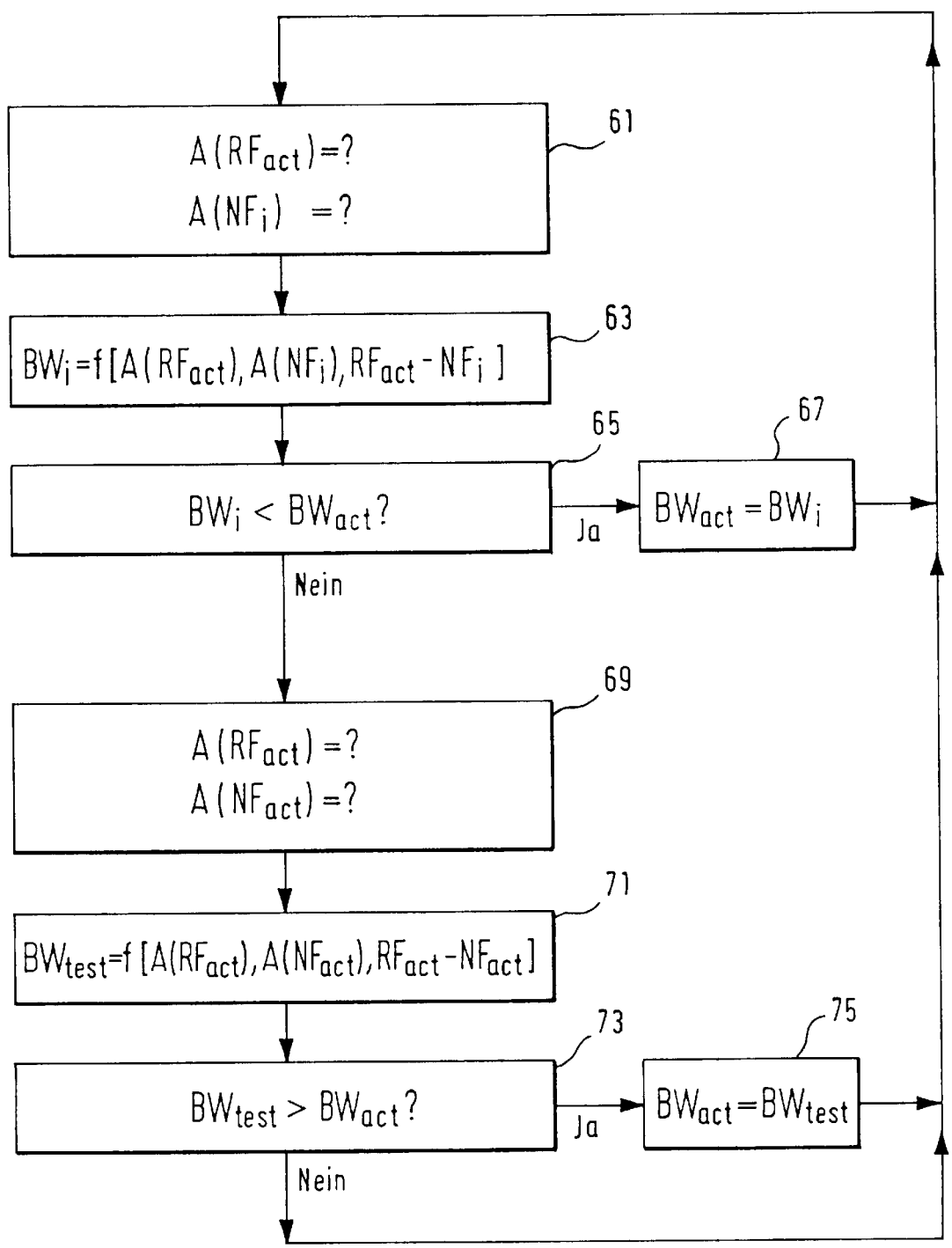
FIG. 4 is a flow chart of steps of the method in accordance with the invention.

FIG. 4 shows as a flow chart a possible implementation of the method in accordance with the invention. After a user signal at a current reception frequency $RF_{act}$ and a neighboring signal at a neighboring frequency $NF_i$ which is adjacent to it have been received in an audio receiver, it is examined whether the corresponding reception conditions make a reduction of the currently set bandpass width $BW_{act}$ necessary.

For this a respective signal parameter $A(NF_i)$ and $A(RF_{act})$ respectively, for example a value corresponding to the received signal level, is determined in a parameter determination step 61. In a subsequent bandwidth determination step 63 a bandpass width $BW_i$ for the intermediate frequency filtering of the user signal is computed as a function of these values as well as of the difference between the currently set reception frequency $RF_{act}$, and the neighboring frequency $NF_i$ which is under consideration.

In a subsequent test step 65, it is examined whether the computed bandpass width $BW_i$ is narrower than the bandwidth $BW_{act}$ which is currently set for the intermediate frequency filtering and which is based on a previous computation. If so, the previously computed, narrower bandwidth $BW_i$ is set in a setting step 67 as the new bandpass width $BW_{act}$.

If in contrast the test step 65 yields a negative result, a current value of the signal parameter $A(RF_{act})$ of the user signal at the frequency $RF_{act}$ which is set at the audio receiver and a current value of the signal parameter $A(NF_i)$ of the neighboring signal at that neighboring frequency $NF_{act}$ which had been used as the basis of the previous computation of the currently used bandpass width $BW_{act}$ are determined in a parameter determination step 69. In other words, it is now to be examined whether the bandpass width $BW_{act}$ which is currently set is in fact still required.

For this a comparison bandwidth $BW_{test}$ is computed in a subsequent bandwidth determination step 71 on the basis of the newly determined signal parameters $A(RF_{act})$ and $A(NF_{act})$ as well as the corresponding frequency difference $RF_{act}-NF_{act}$. In a test step 73 it is then examined whether this comparison bandwidth $BW_{act}$ is greater than the currently set bandpass width $BW_{act}$.

If this is the case a greater value, namely the comparison bandwidth $BW_{test}$, can again be set as the current bandpass width $BW_{act}$ in a setting step 75.

After the test step 73 or where appropriate after the setting step 67 or the setting step 75 this procedure can be started anew with the parameter determination step 61, with a new neighboring frequency $NF_i$, being selected. In this way the bandpass width of the intermediate frequency filtering is updated at specific time intervals.

What is claimed is:

1. A method for controlling the bandpass width in the filtering of an intermediate frequency signal of an audio receiver of a radio reception apparatus, said method comprising the steps of:

determining a signal parameter of a user signal of the audio receiver which is received at a reception frequency;

determining a signal parameter of at least one neighboring signal which is received at a neighboring frequency which is adjacent to the reception frequency; and selecting the bandpass width of the intermediate frequency filtering in dependence at least on the signal parameter which is determined from the user signal, on the signal parameter which is determined from the neighboring signal and on the frequency distance between the reception frequency and the neighboring frequency.

2. The method according to claim,1 wherein the signal parameter of the user signal is determined based on at least one of signal strength of the user signal, deviation of the user signal, and an output signal at a reception quality detector which is associated with the user signal.

3. The method according to claim 1, wherein the signal parameter of the neighboring signal is determined based on at least one of signal strength of the neighboring signal and deviation of the neighboring signal.

4. The method according to claim 1, further comprising the step of heterodyning the signal parameter of the user signal and the signal parameter of the at least one neighboring signal to intermediate frequency signals prior to selecting the bandpass width.

5. The method according to claim 1, wherein the step of selecting the bandpass width of the intermediate frequency filtering comprises the step of comparing the signal parameter of the user signal and the signal parameter of the at least one neighboring signal relative to one another.

6. The method according to claim 1, wherein the step of selecting the bandpass width of the intermediate frequency filtering comprises the step of selecting a narrower bandpass width when one of a higher signal strength, a higher deviation of the neighboring signal with respect to the corresponding signal parameter of the user signal, and a lower frequency distance between the reception frequency and the neighboring frequency.

7. The method according to claim 1, further comprising the step of receiving the neighboring signal with an additional receiver which is substantially independent of the audio receiver.

8. The method according to claim 7, wherein the additional receiver is designed as a data receiver for receiving digitally coded radio data.

9. The method according to claim 1, wherein the step of selecting the bandpass width of the intermediate frequency filtering comprises the steps of receiving an RDS signal on the reception frequency and selecting the bandpass width in dependence on a bit error rate of the received RDS signal.

10. The method according to claim 1, further comprising the step of determining a neighboring signal and a corresponding signal parameter for each of a plurality of different neighboring frequencies, wherein the plurality of different neighboring frequencies preferably have constant frequency distances from one another.

11. The method according to claim 10, further comprising the step of updating the bandpass width of the intermediate frequency filtering using the relevant signal parameter of a newly determined neighboring signal and using the frequency distance between the reception frequency and a neighboring frequency of the newly determined neighboring signal.

12. The method according to claim 11, wherein the updated bandpass width is updated based on the signal parameter of the user signal which had already been previously determined.

13. The method according to claim 1, wherein neighboring signals within a frequency partial range ±300 kHz which is limited with respect to the relevant radio frequency band are determined in the vicinity of the reception frequency of the user signal at regular time intervals and are taken into account for a new determination of the bandpass width.

14. The method according to claim 1, wherein the step of selecting the bandpass width of the intermediate frequency comprises one of activating one filter of a plurality of different filters with predetermined filter properties and at least approximately continuously varying properties of a digital filter.

15. The method according to claim 1, wherein the step of selecting the bandpass width of the intermediate frequency comprises filtering at least one of a predetermined maximum and minimum limiting value of the bandpass width.

16. A radio reception apparatus comprising:
an audio receiver for receiving a user signal at a reception frequency;
an intermediate frequency filter unit for filtering an intermediate frequency signal corresponding to the user signal;
an additional receiver which is substantially independent of the audio receiver for receiving a neighboring signal at a neighboring frequency which is adjacent to the reception frequency of the audio receiver; and
a filter selection unit for selecting a bandpass width for the intermediate frequency filter unit of the audio receiver, wherein the filter selection unit determines a signal parameter of the neighboring signal of the additional receiver and a signal parameter of the user signal of the audio receiver, the filter selection unit comprising a signal processing device for computing at least the signal parameter of the user signal, the signal parameter of the neighboring signal and the frequency distance between the reception frequency and the neighboring frequency with one another, and wherein the bandpass width of the intermediate frequency filter unit of the audio receiver is selected in dependence on an output signal of the signal processing device.

17. The radio reception apparatus according to claim 16, wherein the filter selection unit has a frequency determination device for determining the frequency distance between the reception frequency and the neighboring frequency.

18. The radio reception apparatus according to claim 16, wherein the signal processing device comprises a microprocessor.

19. The radio reception apparatus according to claim 16, wherein the filter selection unit has at least one of a level detector which is associated with the audio receiver, a level detector which is associated with the additional receiver, and a reception quality detector which is associated with the audio receiver.

20. The radio reception apparatus according to claim 16, wherein the additional receiver is designed as a data receiver which is adapted for the reception of digitally coded radio data.

21. The radio reception apparatus according to claim 16, wherein the intermediate frequency filter unit of the audio receiver comprises one of at least two individually activatable filters of different predetermined bandpass width and a digital filter, the bandpass width of which can be varied in a large number of steps within predetermined limits.

* * * * *